United States Patent
Camarota et al.

(10) Patent No.: US 7,154,297 B1
(45) Date of Patent: Dec. 26, 2006

(54) PROGRAMMABLE LOGIC WITH PROGRAMMABLE VOLATILITY

(75) Inventors: Rafael C. Camarota, Sunnyvale, CA (US); Robert Blake, Saratoga, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/905,832

(22) Filed: Jan. 21, 2005

(51) Int. Cl.
*H03K 19/177* (2006.01)
*G06F 7/38* (2006.01)

(52) U.S. Cl. .............................. 326/40; 326/38; 716/17

(58) Field of Classification Search ................. 326/38, 326/39, 40, 41, 46; 716/16, 17
See application file for complete search history.

(56) References Cited

U.S. PATENT DOCUMENTS 6,538,468 B1 * 3/2003 Moore .......................... 326/40
6,839,873 B1 * 1/2005 Moore .......................... 714/725

* cited by examiner

*Primary Examiner*—Daniel D. Chang
(74) *Attorney, Agent, or Firm*—Townsend and Townsend and Crew LLP

(57) ABSTRACT

Volatility of a programmable logic device (PLD) or field programmable gate array (FPGA) is selectable to be volatile or nonvolatile. In the volatile mode, configuration or other data of the integrated circuit are lost once power is removed from the integrated circuit. In the nonvolatile mode, configuration or other data is retained even when power is removed from the integrated circuit. Upon power-up, in nonvolatile mode, the integrated circuit does not need external data. In an embodiment, the mode, whether volatile or nonvolatile, may be selected during manufacturing. In other embodiment, the mode may be selected by other means, such as by the user.

18 Claims, 5 Drawing Sheets

PROGRAMMABLE LOGIC WITH PROGRAMMABLE VOLATILITY

BACKGROUND OF THE INVENTION

The present invention relates to the field of integrated circuits and in particular, to an integrated circuit having selected volatility, selectable to operate as a nonvolatile programmable logic integrated circuit in a first mode or as a volatile programmable logic integrated circuit in a second mode.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit.

Modern programmable logic integrated circuits incorporate programmable logic including logic gates, products terms, or look-up tables. Some programmable logic integrated circuits also included embedded user-programmable memory or RAM. However, this RAM is volatile, which means once power is removed from the integrated circuit, the contents of the RAM are lost.

Further, for a nonvolatile PLD, user application configuration data is stored within the PLD package, and external data is not needed to make the device work at power-up. In contrast, for a volatile PLD, user application configuration data is lost with every power-down cycle. The PLD is configured on each power-up from data external to the PLD package.

Despite the success of programmable logic, there is a continuing desire to provide greater functionality in a programmable logic integrated circuit, but at the same time, provide greater performance. The programmable logic marketplace is divided into two different market segments, complex PLDs (CPLDS) and FPGAs. FPGAs typically have more programmable logic gates and more complexity than CPDs. CPLDs are typically nonvolatile PLDs that require no external source to configure the customer application into the programmable logic array. The FPGA is typically a volatile PLD, which usually needs an external source to configure the customer application into the programmable logic array for each power-up cycle.

For equal architectures and densities, a CPLD is more expensive to manufacture than an FPGA. The CPLD has a more expensive processing cost to add special transistors needed for embedded nonvolatile memory. The CPLD also has lower yield due to the complexities of the nonvolatile memory. The CPLD die size is larger because it has a PLD architecture and the nonvolatile memory and its associated overhead.

The price customers have been willing to pay in the market for CPLDs is higher than FPGAs. The higher price is justified by the nonvolatile, instant-on capabilities of the CPLD. This premium is even higher than the sum of an FPGA and an external nonvolatile device used for power-up configuration. This is a cost for a manufacturer to fabricate and inventory both volatile and nonvolatile devices. And some nonvolatile devices may be fully functional logically, but the nonvolatile memory is not fully functional. It would be cost effective to be able to use such devices as volatile devices rather than throw them away.

Therefore, there is a need for a programmable logic integrated circuit with selected volatility, which is capable of addressing the needs of the marketplace for nonvolatile and volatile devices.

SUMMARY OF THE INVENTION

According to this invention, a programmable logic device (PLD) or field programmable gate array (FPGA) has a volatile mode and a nonvolatile mode. Volatility of the programmable logic integrated circuit is selectable to be volatile or nonvolatile. In the volatile mode, configuration or other data of the integrated circuit are lost once power is removed from the integrated circuit. In the nonvolatile mode, configuration or other data is retained even when power is removed from the integrated circuit. Upon power-up, in nonvolatile mode, the integrated circuit does not need external data. In an embodiment, the mode, whether volatile or nonvolatile, may be selected during manufacturing, such as based on customer orders. In other embodiment, the mode may be selected by other means, such as by the user.

According to an aspect of the invention, a single silicon process mask sequence will produce a product that can be programmed during manufacturing to appear to the end user to be a volatile PLD, (FPGA), or a nonvolatile PLD, (CPLD). The programmability is to the advantage of the manufacturer since one product sold into two markets.

In another aspect of the invention, a special word is programmed into the nonvolatile memory only during a special manufacturing mode that is inaccessible by the end user. This word is read at device power-up to determine if the device is to behave as a volatile PLD or a nonvolatile PLD. The special word will be defined so that minimal nonvolatile memory functionality is required and, therefore, so that volatile memory devices have higher yield than nonvolatile PLD devices that require full nonvolatile memory functionality.

An alternative implementation would use a bond pad left floating or down bonded to ground inside the PLD package, this bond pad is read at device power-up to determine if the device is to behave as a volatile PLD or a nonvolatile PLD. The special bond pad will be defined so that nonvolatile memory functionality is not required in the volatile PLD and, therefore, so that volatile memory devices have higher yield than nonvolatile PLD devices that require full nonvolatile memory functionality.

A further alternative implementation would use a laser fuse, this fuse is read at device power-up to determine if the device is to behave as a volatile PLD or a nonvolatile PLD. The special fuse will be defined so that nonvolatile memory functionality is not required in the volatile PLD and, therefore, so that volatile memory devices have higher yield than nonvolatile PLD devices that require full nonvolatile memory functionality.

A still further alternative implementation would use a single metal mask layer variation, this metal mask variation determines if the device is to behave as a volatile PLD or a nonvolatile PLD. The single metal mask layer will be defined so that no nonvolatile memory functionality is required in the volatile PLD and, therefore, so that volatile memory devices have higher yield than nonvolatile PLD devices that require full nonvolatile memory functionality.

Other objects, features, and advantages of the present invention will become apparent upon consideration of the following detailed description and the accompanying drawings, in which like reference designations represent like features throughout the figures.

DETAILED DESCRIPTION

Figure 1:
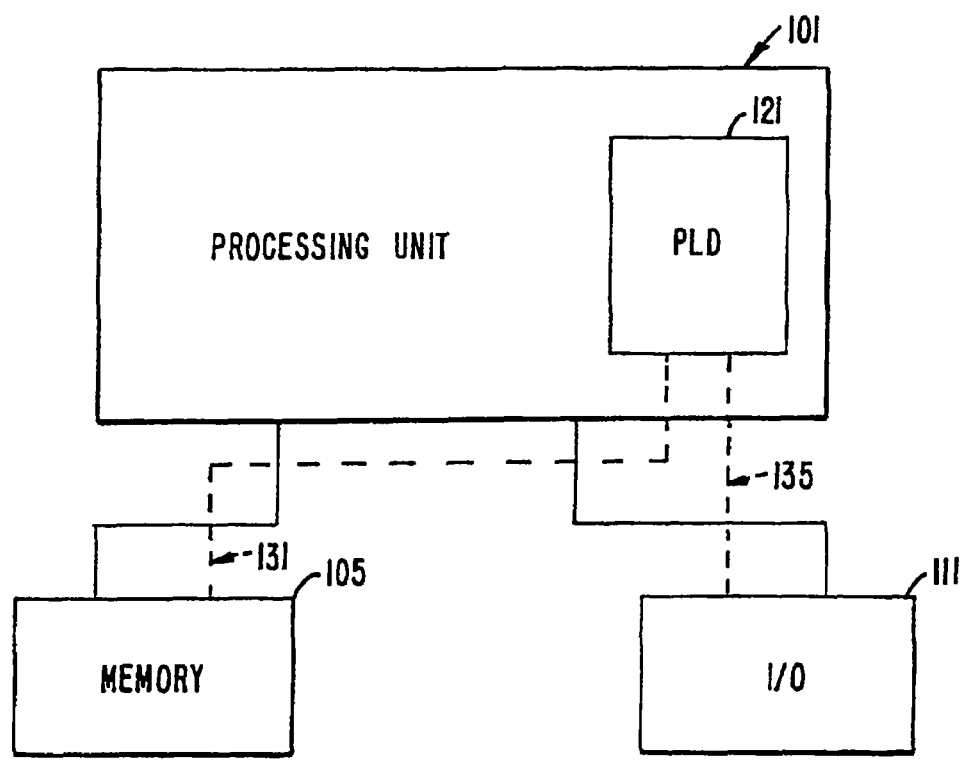
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. Examples of current programmable logic devices are represented by Altera's Classic, MAX®, Hardcopy™, FLEX®, APEX™, and STRATIX® series of PLDs. These are described in, for example, U.S. Pat. Nos. 4,617,479, 4,871,930, 5,241,224, 5,258,668, 5,260,610, 5,260,611, 5,436,575, and the Altera Data Book (2003). Programmable logic integrated circuits and their operation are well known to those of skill in the art.

In the particular embodiment of FIG. 1, a processing unit 101 is connected to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, wireless devices, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit.

Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task.

Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
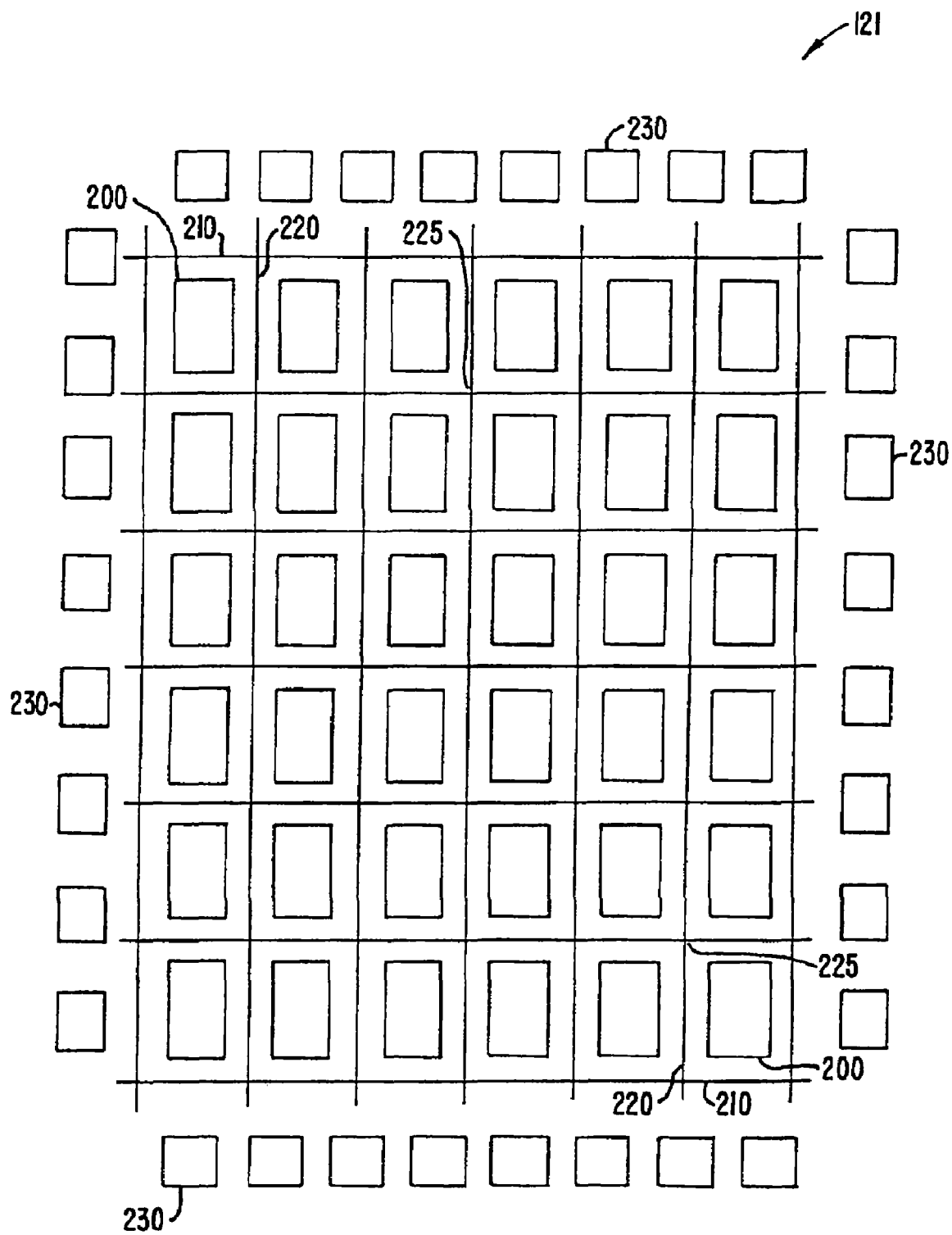
FIG. 2 is a diagram showing an architecture of a programmable logic integrated circuit.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location of PLD portion 154 to another LAB 200 at another location of PLD portion 154. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows at the peripheries of the chip, input and output or I/O circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output or I/O drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
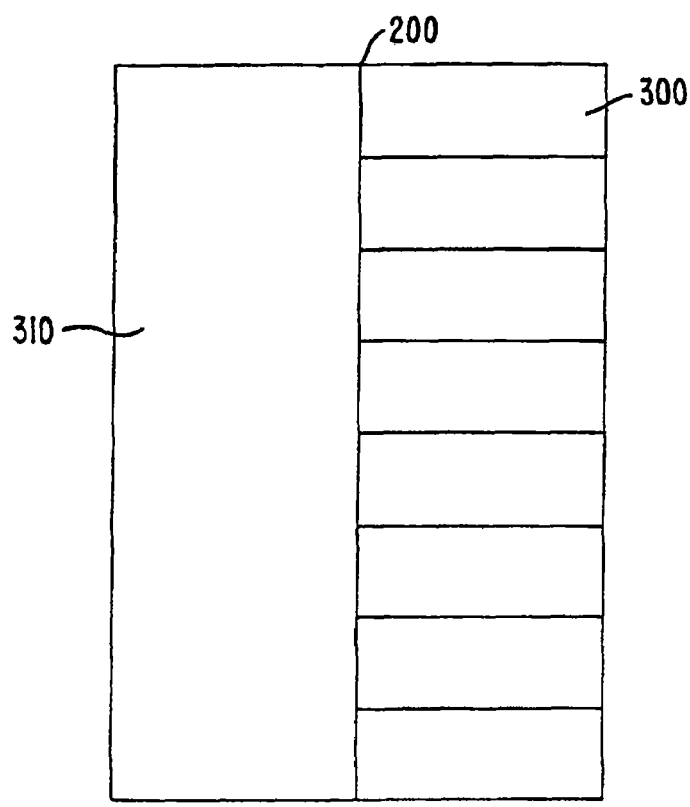
FIG. 3 is a simplified block diagram of a logic array block (LAB).

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
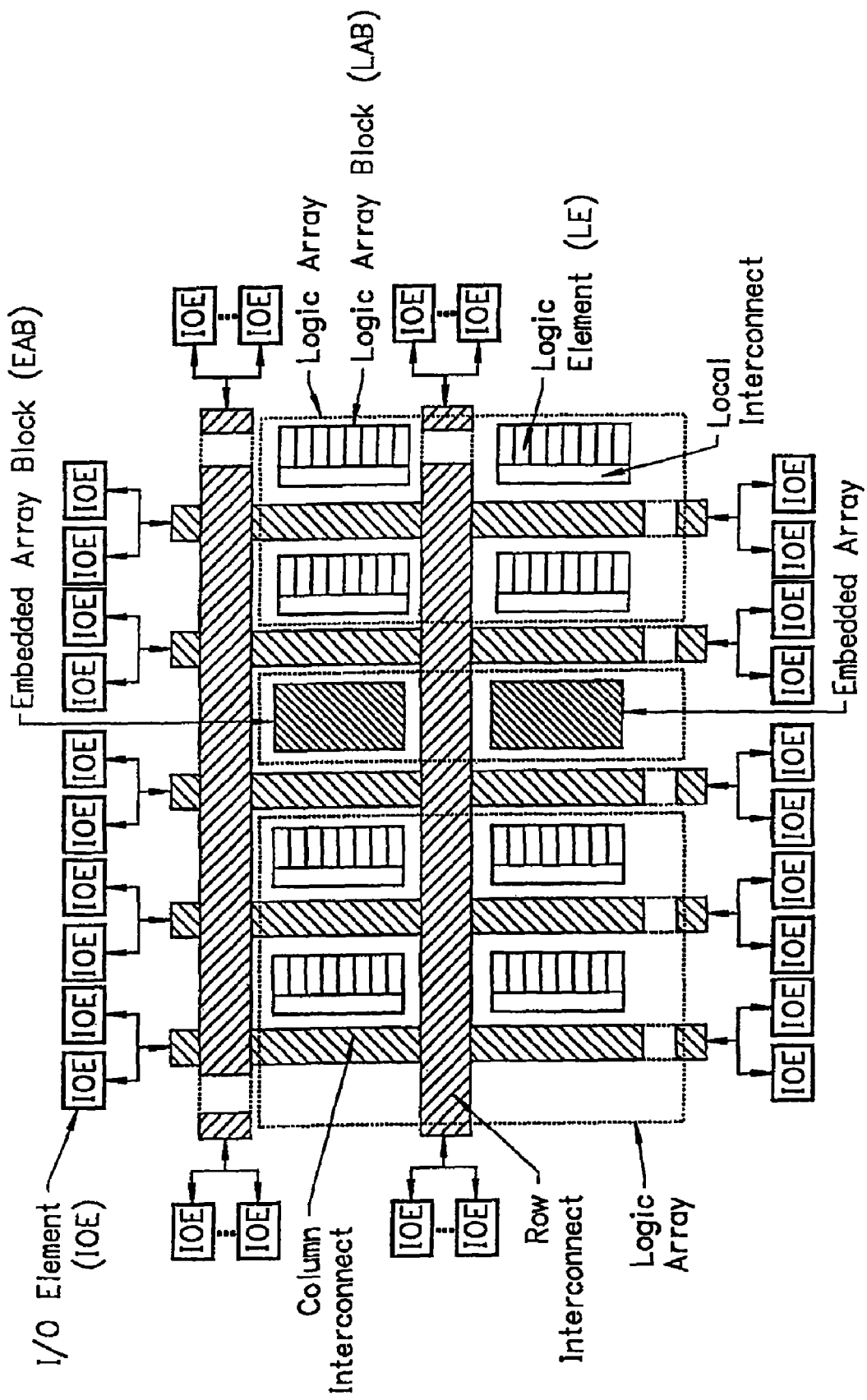
FIG. 4 shows an architecture of a programmable logic integrated circuit with embedded array blocks (EABs).

FIG. 4 shows a programmable logic architecture. The architecture in FIG. 4 further includes (small) embedded array blocks (EABs). EABs contain user memory, a flexible block of RAM. More discussion of this architecture may be found in the Altera Data Book (2003) in the description of the FLEX 10K product family and also in U.S. Pat. No. 5,550,782. Some or all of the input-output or I/O elements may be consistent with embodiments of the present invention. The embedded array blocks can be configured as FIFOs acting as frequency translators and serial to parallel converters for interfacing between high-speed input and outputs and the core circuits including the logic array blocks. Other architectures such as Altera's APEX™ and STRATIX® family of products are described in detail in the their respective data sheets, available via the Internet at www.altera.com.

Some programmable logic integrated circuits are configured by using on-chip nonvolatile memory cells such as EEPROM, EPROM, Flash, other floating gate or nonvolatile memory element technology, FRAM, MRAM, or polysilicon and metal fuses. Some examples of such devices are Altera's Classic, FLEXLogic, and MAX series of devices. Some integrated circuits are configured using on-chip volatile memory cells such as static RAM (SRAM) memory element technology. Some examples of such devices are Altera's FLEX and APEX series of devices.

Nonvolatile memory devices retain their configuration even when power is removed from the integrated circuit. In comparison, volatile devices lose their programming when power is removed. Therefore, for the SRAM-based and other similar devices, these programmable logic integrated circuits need to be configured on power up. One technique of programming these devices is to store the configuration information in a nonvolatile device such as a serial EPROM with nonvolatile memory. Upon power-up, the configuration data from the serial EPROM integrated circuit is transferred to configure the programmable logic integrated circuit. As long as power is supplied to the volatile programmable logic integrated circuit, the device will retain its programming and needs not be reprogrammed or refreshed.

Figure 5:
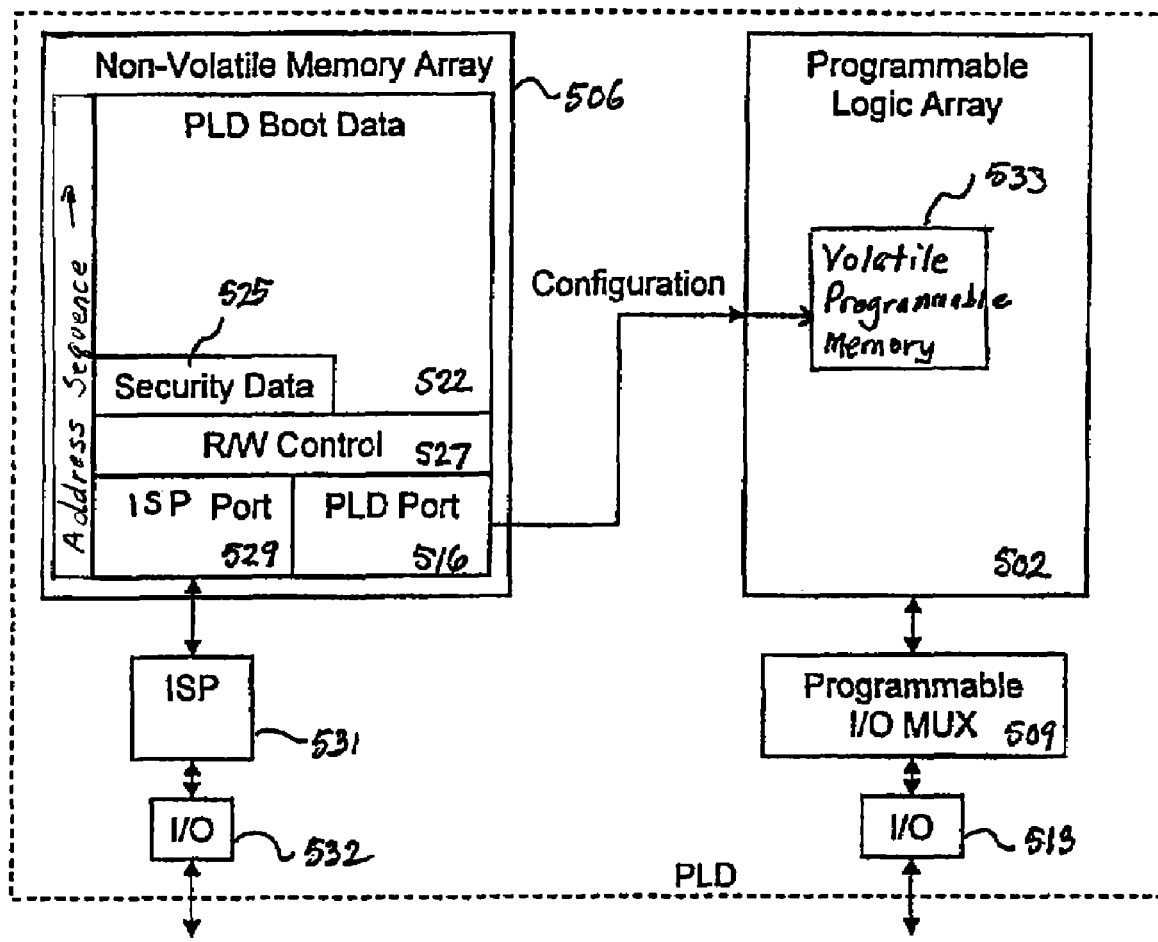
FIG. 5 shows a block diagram of a programmable logic integrated circuit with an embedded nonvolatile memory array.

FIG. 5 shows a programmable logic integrated circuit having a programmable logic array portion 502 and a nonvolatile memory array 506. Both portions reside on the same integrated circuit substrate. The programmable logic array portion uses volatile memory technology. The nonvolatile memory array has nonvolatile memory cells such as EEPROM, Flash, other floating gate or nonvolatile memory element technology, FRAM, MRAM, or polysilicon and metal fuses to store configuration information. The configuration information in the nonvolatile memory portion may be used to configure the logic of the programmable logic array portion upon power up.

Programmable logic array 502 has inputs and outputs to a programmable I/O multiplexer or mux 509. The programmable I/O multiplexer connects selected programmable array nets to external I/O transceivers 513. The programmable logic array also has an input from a nonvolatile memory (NVM) PLD port 516. In an specific implementation, this read-only port transfers nonvolatile memory data to the volatile programmable logic array memory and its volatile programmable memory (VPM) 533 at power up. An oscillator block (OSC) 518 generates a clock for the transfer of data from the NVM to the VPM 533 at power up. The OSC has an input to enable and disable it to save power. When the oscillator is not running, power is saved.

The nonvolatile memory array has various parts: (1) PLD boot data 522 is an array of nonvolatile memory cells. (2) Security data 525 is a special set of nonvolatile bits used to disable in-system programming (ISP) read access. (3) R/W control 527 is the high voltage and analog circuits used to read and write the memory bits. (4) ISP port 529 is the digital access to the nonvolatile data. (5) PLD port 516 is a second read-only digital access to the nonvolatile data.

In a specific embodiment, the ISP and PLD access ports to the nonvolatile memory data are asymmetric. The PLD port is read only and very wide. It is wide to reduce power-up configuration time. The ISP port has a narrower word width that is more efficient for ISP programming. An ISP block 531 connects the nonvolatile memory to the ISP JTAG pins 532 for program and verify of the nonvolatile memory. The ISP block will restrict reading of the configuration data if appropriate security bits are set. This allows a user to protect and secure the user's configuration data.

The nonvolatile memory array has various parts: (1) PLD boot data is an array of nonvolatile memory cells. (2) First word (1st word) is a special set of nonvolatile bits read first into control registers during power-up. (3) R/W control is the high-voltage and analog circuits used to read and write the memory bits. (4) JTAG port has full digital access to the nonvolatile data. (5) PLD port is a second read-only digital access port to the nonvolatile data. (6) Address sequence block controls data transfer at power-up.

In an embodiment, the JTAG and programmable logic access ports to the nonvolatile memory data are asymmetric. The PLD port is read only and very wide. It is wide to reduce power-up configuration time. The JTAG port has a word width that is more efficient for in-system or ISP programming. The address sequence block controls the transfer of data from the nonvolatile memory array to the 1st word control register and the PLD configuration memory.

Further, data is transferred to the 1st word control register at power-up. The value in the 1st Word determines if the PLD is loaded with remaining data to the PLD configuration memory. The ISP JTAG State Machine block connects the nonvolatile memory to the ISP JTAG pins for program and verify of the nonvolatile memory and boundary scan functions. The ISP JTAG state machine block will be restricted to only boundary scan functions and nonvolatile memory erase when the 1st word indicates a secure mode.

Figure 6:
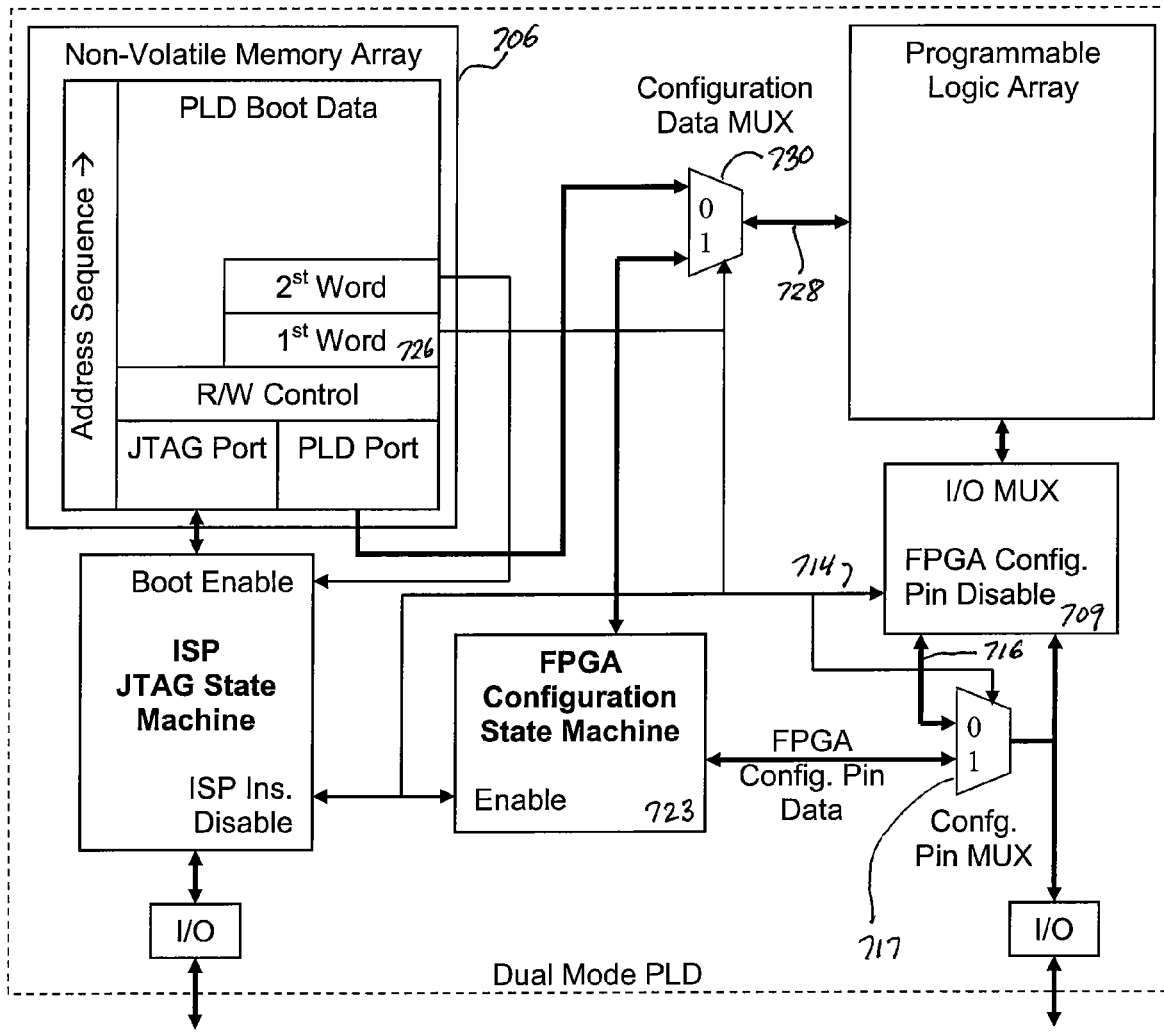
FIG. 6 shows a block diagram of a programmable logic integrated circuit with selected volatility, either a nonvolatile active mode or a volatile active mode.

The invention provides a programmable logic integrated circuit with selected volatility, operating in either a nonvolatile active mode or volatile active mode. FIG. 6 shows a selectable FPGA configuration interface to a nonvolatile PLD architecture, such as depicted in FIG. 5. Compared to the PLD FIG. 5, FIG. 6 architecture has additions and changes to provide a dual-mode PLD. The two modes are a volatile mode and nonvolatile mode. The mode may be selected using a volatility control element, which indicates whether the device or integrated circuit will be in a nonvolatile active mode or volatile active mode.

When in the nonvolatile active mode, the nonvolatile memory portion of the integrated circuit is connected to the programmable logic array portion. The nonvolatile memory portion includes nonvolatile memory elements to store configuration data for configuring the programmable logic array portion upon power-up of the integrated circuit. Operation of the device in the nonvolatile active mode are as described above.

When in the volatile active mode, configuration data for configuring the programmable logic array portion upon power-up of the integrated circuit is provided by an external source. This external source may be a nonvolatile memory such as a serial EPROM. In this mode, the nonvolatile memory portion of the integrated circuit is not used for storing configuration data, which means it is inactive or deactivated. Some of the nonvolatile memory cells may be available for use for specific purposes, such as configuration storage or word to control whether the device is in the nonvolatile active mode or volatile active mode. Other control words may be available. The majority of the nonvolatile memory cells are not available for use.

In embodiments, the volatility mode of the device may be selected by at least one of a nonvolatile memory cell, nonvolatile memory word, Flash memory, electrically erasable memory, laser fuse, mask programmable metal option, bonding pad, or control pad. The mode may be selected by any combination of these options. Furthermore, any other technique or means may be used to select the mode, including using a means not specified in the above list.

A decision whether the integrated circuit is in the nonvolatile or volatile mode may depend on one or more measured or evaluated characteristic of the integrated circuit, or combinations of these characteristics. These characteristic, which may be an electrically measurable or other characteristics, may indicate whether the nonvolatile memory elements are usable and have good operating parameters. For example, if a large number, such as a majority, of the nonvolatile memory cells are unusable, then the integrated circuit should be configured for the volatile active mode. The number of unusable nonvolatile memory cells before the device is targeted for the volatile active mode may be determined by the manufacturer. For example, if more than two percent, five percent, ten percent, fifteen percent, of the cells are unusable, then the volatile active mode.

A nonvolatile memory cell may be unusable for one of or a combination of a number of reasons. For example, the nonvolatile memory cell may not meet desired or specific electrical characteristics, operating characteristics, reliability characteristics, or longevity characteristics. The characteristics of the nonvolatile memory cell may be evaluated during fabrication of the integrated circuit, during testing of the integrated circuit after fabrication, during testing of the integrated circuit after packaging, or at other times.

FIG. 6 shows a specific implementation of a programmable logic integrated circuit according to the invention. The programmable logic array has inputs and outputs to a programmable I/O MUX 709. The programmable I/O MUX connects selected programmable array nets to external I/O transceivers, and connections 714 disable PLD array control of to used in FPGA configuration (e.g., 10 to 13 I/O). When enabled some IO 716 are connected by a configuration pin MUX 717 between the FPGA configuration state machine 723 and the IO. Normally the IO are controlled by the PLD array. The selection is controlled by the value in the first word 726 read from the nonvolatile memory. The connections 714 enable the PLD to look like a volatile FPGA.

The programmable logic array also has a connection 728 to the configuration data MUX 730. This MUX selectively connects the configuration data source between the nonvolatile memory 706 and the FPGA configuration state machine 723. The selection is controlled by value in the first word read from the nonvolatile memory. The nonvolatile memory connection to the configuration data MUX transfers nonvolatile memory data to the volatile programmable-logic-array memory at power-up.

The nonvolatile memory array has various parts: (1) PLD boot data is an array of nonvolatile memory cells. (2) First word (1st word) is a special set of nonvolatile bits read first into control registers during power-up. (3) Second word (2nd word) is a special set of nonvolatile bits optionally read into control registers during power-up. (4) R/W control is the high-voltage and analog circuits used to read and write the nonvolatile memory bits. (5) JTAG port has full digital access to the nonvolatile data. (6) PLD Port is a second read-only digital access to the nonvolatile data. (7) Address sequence block controls data transfer at power-up.

In an implementation, the JTAG and PLD access ports to the nonvolatile memory data are asymmetric. The PLD port is read only and very wide. It is wide to reduce power-up configuration time. The JTAG port has a word width that is more efficient for ISP programming. The Address Sequence block controls the transfer of data from the nonvolatile memory array to the 1st word control register, 2nd word control register, and the PLD configuration memory. Data is transferred to the 1st word control register at power-up.

The value in the 1st word determines if the PLD is volatile or nonvolatile. If nonvolatile, the nonvolatile memory access will continue reading the 2nd word to a control register, and then based on this value possibly continue transferring the remaining data to the PLD configuration memory. If the device is volatile data transfer from the nonvolatile memory will stop, the configuration data MUX and the configuration pin MUX will be set to give the FPGA configuration state machine full control of the PLD configuration memory and FPGA configuration IOs. This will also disable ISP JTAG state-machine instructions that allow program and verify of the nonvolatile memory array.

The ISP JTAG state machine block connects the nonvolatile memory to the ISP JTAG pins for program and verify of the nonvolatile memory and boundary scan functions. The ISP JTAG state machine block will be restricted to only boundary scan functions when the 1st word indicates volatile mode. The FPGA configuration state machine block is a pin selectable circuit that configures the PLD configuration in various modes including automatic serial configuration at power-up. The FPGA configuration state machine block is programmable to allow it to support multiple standard configuration protocols.

In an implementation, the programming or configuration of the volatility control element (e.g., first word) is accessible by an integrated circuit manufacturer of the integrated circuit. The volatility control element may be only accessible by an integrated circuit manufacturer of the integrated circuit. The volatility control element is inaccessible by a user. In other implementations, however, the volatility control element may be accessible by a user.

In other implementations, the volatility control element may not be the one or more nonvolatile memory cells as described in the FIG. 6 implementation above. For example, the volatility control element may be a control pad or bonding pad. And depending on where control pad is connected, the integrated circuit will be in the nonvolatile or volatile active mode. For example, when the control pad floats, the integrated circuit will be in volatile active mode. And when the control pad is connected to a supply voltage, the integrated circuit will be in a nonvolatile active mode. This supply voltage may be ground, VCC, or some bias voltage or other voltage. The scheme may also operate in reverse where a floating control pad indicates nonvolatile active mode and when connected to a voltage, indicates a volatile active mode.

Furthermore, in another implementation, the pad may be connected to one voltage, for example, VCC for one mode, and to another voltage, such as ground, for the other mode. Many variations are possible using a control pad or bonding pad as the volatility control element. According to a technique, the control pad is connected to the supply voltage by a manufacturer of the integrated circuit.

In another implementation, the volatility control element includes a laser fuse. The laser fuse is blown or disconnected to indicate one of the volatility modes, and left intact or not blown to indicate the other volatility mode. The laser fuse may be programmed (e.g., blown) using a laser. Alternatively, the volatility control element may be another type of fuse, such as a metal fuse, programmable by electrical voltage or current. The fuse may be an antifuse device. Other possible techniques may be used to implement the fuse functionality.

In another implementation, the invention is a technique of fabricating an integrated circuit. The integrated circuit is defined using a number of masking steps in a photolithography process. During a volatility selection masking step, the processing will use a first mask to indicate the integrated circuit will be operate in a nonvolatile active mode. During the volatility selection masking step, the processing will use a second mask to indicate the integrated circuit will be operate in a volatile active mode. The volatility selection masking step may be a metal masking step, such as different metal masks (e.g., first mask or second mask) to enable or disable for nonvolatile support. Masking steps other than the metal mask may be used, but metal mask are typically later in the process and more is known about the integrated circuit in which to determine whether the nonvolatile mode should be enabled.

For example, before the volatility selection masking step, characteristics of the integrated circuit may be evaluated. These evaluated characteristics may provide an indication of the yield of the nonvolatile memory cells. And based on the evaluated characteristics, processing is selected for the volatility selection masking step using the first mask or the second mask, which would select the nonvolatile or volatile mode.

Furthermore, in another implementation, the invention is a technique of operating an integrated circuit including providing a programmable logic array portion of the integrated circuit. The programmable logic array portion includes logic array blocks and programmable interconnect configurable using volatile memory elements to implement user functions. There is a nonvolatile memory portion of the integrated circuit. A volatility control element of the integrated circuit will be altered to indicate whether the integrated circuit will be in a nonvolatile active mode or a volatile active mode.

Before altering a volatility control element of the integrated circuit, the technique may further evaluate at least one characteristic of the integrated circuit. This characteristic may indicate whether a number or selected percentage of the nonvolatile memory cells are operable or nonoperable, as discussed above. Based on the evaluated characteristic, the technique further selectively alters the volatility control element to be in the nonvolatile active mode or volatile active mode.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit comprising:
    a programmable logic array portion of the integrated circuit, comprising logic array blocks and programmable interconnect configurable using volatile memory elements to implement user functions;
    a nonvolatile memory portion of the integrated circuit, wherein when in a nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit; and a volatility control element, wherein the volatility control element indicates whether the integrated circuit is in a nonvolatile active mode or a volatile active mode, and when the integrated circuit is in the volatile active mode, configuration data for configuring the programmable logic array portion upon power-up of the integrated circuit is provided by an external source, wherein in the volatile active mode, the configuration data for configuring the programmable logic array portion is not stored in the nonvolatile memory portion of the integrated circuit.

2. The integrated circuit of claim 1 wherein the volatility control element is accessible by an integrated circuit manufacturer of the integrated circuit.

3. The integrated circuit of claim 1 wherein the volatility control element is inaccessible by a user.

4. The integrated circuit of claim 1 wherein the volatility control element is accessible by a user.

5. The integrated circuit of claim 1 wherein the volatility control element comprises a nonvolatile memory cell.

6. The integrated circuit of claim 1 wherein the volatility control element comprises a control pad.

7. The integrated circuit of claim 1 wherein the configuration data for configuring the programmable logic array portion upon power-up of the integrated circuit is stored in a boot partition of the nonvolatile memory portion and a user data partition of the nonvolatile memory portion is used to store user data.

8. An integrated circuit comprising:

a programmable logic array portion of the integrated circuit, comprising logic array blocks and programmable interconnect configurable using volatile memory elements to implement user functions;

a nonvolatile memory portion of the integrated circuit, wherein when in a nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit; and a volatility control element, wherein the volatility control element indicates whether the integrated circuit is in a nonvolatile active mode or a volatile active mode, and when the integrated circuit is in the volatile active mode, configuration data for configuring the programmable logic array portion upon power-up of the integrated circuit is provided by an external source, wherein the volatility control element comprises a control pad, that indicates the nonvolatile active mode when the control pad floats, and that indicates the volatile active mode when the control pad is coupled to a supply voltage.

9. The integrated circuit of claim 8 wherein the supply voltage is ground or VCC.

10. The integrated circuit of claim 8 where the control pad is coupled to the supply voltage by a manufacturer of the integrated circuit.

11. An integrated circuit comprising:

a programmable logic array portion of the integrated circuit, comprising logic array blocks and programmable interconnect configurable using volatile memory elements to implement user functions;

a nonvolatile memory portion of the integrated circuit, wherein when in a nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit; and a volatility control element, wherein the volatility control element indicates whether the integrated circuit is in a nonvolatile active mode or a volatile active mode, and when the integrated circuit is in the volatile active mode, configuration data for configuring the programmable logic array portion upon power-up of the integrated circuit is provided by an external source, wherein the volatility control element comprises a control pad, that indicates the nonvolatile active mode while the control pad is coupled to a supply voltage, and, that indicates the volatile active mode when the control pad is floats.

12. The integrated circuit of claim 11 wherein the supply voltage is ground or VCC.

13. The integrated circuit of claim 11 where the control pad is coupled to the supply voltage by a manufacturer of the integrated circuit.

14. An integrated circuit comprising:

a programmable logic array portion of the integrated circuit, comprising logic array blocks and programmable interconnect configurable using volatile memory elements to implement user functions;

a nonvolatile memory portion of the integrated circuit, wherein when in a nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit; and a volatility control element, wherein the volatility control element indicates whether the integrated circuit is in a nonvolatile active mode or a volatile active mode, and when the integrated circuit is in the volatile active mode, configuration data for configuring the programmable logic array portion upon power-up of the integrated circuit is provided by an external source, wherein the volatility control element comprises a laser fuse, that indicates the nonvolatile active mode when the laser fuse is disconnected, and that indicates the volatile active mode when the laser fuse remains intact.

15. An integrated circuit comprising:

a programmable logic array portion of the integrated circuit, comprising logic array blocks and programmable interconnect configurable using volatile memory elements to implement user functions;

a nonvolatile memory portion of the integrated circuit, wherein when in a nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit; and a volatility control element, wherein the volatility control element indicates whether the integrated circuit is in a nonvolatile active mode or a volatile active mode, and when the integrated circuit is in the volatile active mode, configuration data for configuring the programmable logic array portion upon power-up of the integrated circuit is provided by an external source, wherein the volatility control element comprises a laser fuse, that indicates the nonvolatile active mode when the laser fuse remains intact, and that indicates the volatile active mode when the laser fuse is disconnected.

16. A method of operating an integrated circuit comprising:

providing a programmable logic array portion of the integrated circuit, comprising logic array blocks and programmable interconnect configurable using volatile memory elements to implement user functions;

providing a nonvolatile memory portion of the integrated circuit; and altering a volatility control element of the integrated circuit to indicate whether the integrated circuit is in a nonvolatile active mode or a volatile active mode, wherein when in the nonvolatile active mode, the nonvolatile memory portion is coupled to the programmable logic array portion, the nonvolatile memory portion comprising nonvolatile memory elements to store configuration data for configuring the programmable logic array portion upon power-up of the integrated circuit, and wherein when in the volatile active mode, configuration data for configuring the programmable logic array portion upon power-up of the integrated circuit is provided by an external source, wherein in the volatile active mode, the configuration data for configuring the programmable logic array portion is not stored in the nonvolatile memory portion of the integrated circuit.

17. The method of claim 16 further comprising:

before altering a volatility control element of the integrated circuit, evaluating at least one characteristic of the integrated circuit; and based on the evaluated characteristic, selecting to alter the volatility control element to be in the nonvolatile active mode or volatile active mode.

18. The method of claim 16 wherein volatility control element comprises at least one of a nonvolatile memory cell, nonvolatile memory word, Flash memory, electrically erasable memory, laser fuse, mask programmable metal option, bonding pad, or control pad.

* * * * *